(12) United States Patent
Wu

(10) Patent No.: US 11,991,899 B2
(45) Date of Patent: May 21, 2024

(54) DISPLAY PANEL, INCLUDING A SCATTERING LAYER WITH MICROPORES PREPARATION METHOD, AND DISPLAY DEVICE

(71) Applicant: TCL China Star Optoelectronics Technology Co., Ltd., Shenzhen (CN)

(72) Inventor: Linglian Wu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/960,555

(22) PCT Filed: May 15, 2020

(86) PCT No.: PCT/CN2020/090564
§ 371 (c)(1),
(2) Date: Jul. 8, 2020

(87) PCT Pub. No.: WO2021/217738
PCT Pub. Date: Nov. 4, 2021

(65) Prior Publication Data
US 2023/0117011 A1    Apr. 20, 2023

(30) Foreign Application Priority Data
Apr. 28, 2020   (CN) .......................... 202010349602.3

(51) Int. Cl.
*H10K 50/854*    (2023.01)
*H10K 50/844*    (2023.01)
*H10K 59/12*    (2023.01)
*H10K 59/17*    (2023.01)
*H10K 71/00*    (2023.01)
*H10K 102/00*    (2023.01)

(52) U.S. Cl.
CPC ......... *H10K 50/854* (2023.02); *H10K 50/844* (2023.02); *H10K 71/00* (2023.02); *H10K 59/12* (2023.02); *H10K 59/1201* (2023.02); *H10K 59/17* (2023.02); *H10K 2102/331* (2023.02)

(58) Field of Classification Search
CPC .... H10K 50/854; H10K 50/844; H10K 71/00; H10K 59/12; H10K 59/17
See application file for complete search history.

(56) References Cited

U.S. PATENT DOCUMENTS

2007/0262708 A1\* 11/2007 Tanaka ................... H10K 50/85
313/504
2014/0042422 A1\* 2/2014 Silverman ............ H10K 50/858
257/40

(Continued)

FOREIGN PATENT DOCUMENTS

| CN | 1645977 A | 7/2005 |
|---|---|---|
| CN | 105895826 A | 8/2016 |
| CN | 106328819 A | 1/2017 |

*Primary Examiner* — Nduka E Ojeh
(74) *Attorney, Agent, or Firm* — Nathan & Associates; Menachem Nathan

(57) ABSTRACT

A display panel, a preparation method, and a display device are disclosed, including an array substrate, an organic light emitting diode (OLED) light emitting device disposed on a side of the array substrate, and a scattering layer disposed on a side of the OLED light emitting device away from the array substrate, wherein the scattering layer has a plurality of micropores.

8 Claims, 2 Drawing Sheets

(56) References Cited

U.S. PATENT DOCUMENTS

| | | |
|---|---|---|
| 2014/0264316 A1 | 9/2014 | Setz et al. |
| 2015/0144900 A1 | 5/2015 | Lee et al. |
| 2017/0261658 A1 | 9/2017 | Kim et al. |
| 2017/0263893 A1* | 9/2017 | Kim ................... H10K 71/00 |
| 2019/0019995 A1* | 1/2019 | Kim ................. H10K 71/135 |
| 2019/0198814 A1* | 6/2019 | Ge .................... H10K 59/12 |

* cited by examiner

DISPLAY PANEL, INCLUDING A SCATTERING LAYER WITH MICROPORES PREPARATION METHOD, AND DISPLAY DEVICE

FIELD OF INVENTION

The present disclosure relates to the technical field of displays, and in particular to a display panel, a preparation method thereof, and a display device.

BACKGROUND OF DISCLOSURE

An existing organic light emitting diode (OLED) structure has the advantages of self-luminescence, wide viewing angles, high contrast, low power consumption, and extremely high reaction rates, and has become one of the current mainstream display technologies.

Since organic light emitting components are highly sensitive to water and oxygen, in order to protect the organic light emitting components, OLEDs need to be encapsulated. At present, the commonly used encapsulating methods are traditional glass cover encapsulation, thin film encapsulation (TFE), etc., in order to improve the dependence of the encapsulation structure. The current TFE structure is an organic/inorganic multilayer stack structure, in which the inorganic layer realizes the function of blocking water and oxygen, and the organic layer realizes the function of planarization.

Refer to FIG. 1, which is a schematic structural diagram of a display panel 100 in the prior art. The display panel 100 includes an array substrate 110, an OLED light emitting device 120 disposed on the array substrate 110, and a thin film encapsulation layer 130 disposed on the OLED light emitting device 120. The thin film encapsulation layer 130 includes a first inorganic layer 131, a first organic layer 132 disposed on the first inorganic layer 131, and a second inorganic layer 133 disposed on the first inorganic layer 132. Because the material property of the OLED light emitting device 120 causes total internal reflection in the device, only part of the light passes through the thin film encapsulation layer 130, resulting in low light output of the OLED light emitting device. The light output of the OLED light emitting device directly affects the overall display panel performance.

Therefore, it is indeed necessary to develop a new type of display panel to overcome the defects of the prior art.

SUMMARY OF INVENTION

Technical Problems

An object of the present disclosure is to provide a display panel, which can solve the problem that the organic light emitting diode (OLED) light emitting device has a low light output rate in the prior art.

To achieve the above object, the present disclosure provides a display panel, including: an array substrate; an organic light emitting diode (OLED) light emitting device disposed on a side of the array substrate; and a scattering layer disposed on a side of the OLED light emitting device away from the array substrate, and covering the OLED light emitting device; wherein the scattering layer has a plurality of micropores.

The scattering layer is disposed on an OLED light emitting device, and the scattering layer has a plurality of micropores, so that when the OLED light emitting device emits light, the light is scattered to the surroundings through the micropores in the scattering layer, thereby improving the light extraction rate of the OLED light emitting device and improving the overall performance of the display panel.

Furthermore, in other embodiments, the OLED light emitting device comprises: an anode layer disposed on the array substrate; a hole transport layer disposed on the anode layer; a light emitting layer disposed on the hole transport layer; an electron transport layer disposed on the light emitting layer; and a cathode layer disposed on the electron transport layer.

Furthermore, in other embodiments, the display panel further includes a thin film encapsulation layer disposed on the side of the OLED light emitting device away from the array substrate, and including: a first inorganic layer; a first organic layer disposed on the first inorganic layer; and a second inorganic layer disposed on the first organic layer; wherein the scattering layer is disposed between the cathode layer and the first inorganic layer, or/and the scattering layer is disposed between the first inorganic layer and the first organic layer, or/and the scattering layer is disposed on the second inorganic layer.

Furthermore, in other embodiments, a material of the scattering layer is silicon nitride or silicon oxide, and a thickness of the scattering layer ranges from 0.1 μm to 2 μm.

Furthermore, in other embodiments, diameters of the micropores range from 10 nm to 50 nm.

To achieve the above object, the present disclosure provides a preparation method for preparing the display panel, including: a step of provide an array substrate; a step of preparing an organic light emitting diode (OLED) light emitting device disposed on a side of the array substrate; and a step of preparing a scattering layer on a side of the OLED light-emitting device away from the array substrate; wherein the scattering layer has a plurality of micropores.

The scattering layer is disposed on an OLED light emitting device, and the scattering layer has a plurality of micropores, so that when the OLED light emitting device emits light, the light is scattered to the surroundings through the micropores in the scattering layer, thereby improving the light extraction rate of the OLED light emitting device and improving the overall performance of the display panel.

Furthermore, in other embodiments, the step of preparing the scattering layer includes: a step of preparing a silicide film on the side of the OLED light emitting device away from the array substrate; a step of implanting ions into the silicide film; and a step of annealing the ions implanted silicide film, wherein the ions form micropores in the silicide film to form the scattering layer.

Furthermore, in other embodiments, the silicide film is prepared by chemical deposition or inkjet printing.

Furthermore, in other embodiments, the silicide film includes a silicon nitride film or a silicon oxide film, and the ions are helium ions. In other embodiments, the material of the scattering layer may not be limited to a silicide film, as long as the material ensures that the micropores 211 can be formed in the layer after the ion implantation and annealing process.

To achieve the above object, the present disclosure provides a display device including the display panel in accordance with the present disclosure.

Beneficial Effect

Compared with the prior art, the beneficial effect of the present disclosure is that a display panel, a manufacturing method thereof, and a display device are provided, wherein the scattering layer is disposed on an OLED light emitting device, and the scattering layer has the plurality of micropores, so that when the OLED light emitting device emits light, the light is scattered to the surroundings through the micropores in the scattering layer, thereby improving the light extraction rate of the OLED light emitting device and improving the overall performance of the display panel.

BRIEF DESCRIPTION OF DRAWINGS

The technical solutions and other beneficial effects of the present disclosure is apparent through the detailed description of the specific implementation of the present disclosure in conjunction with the accompanying drawings.

Figure 1:
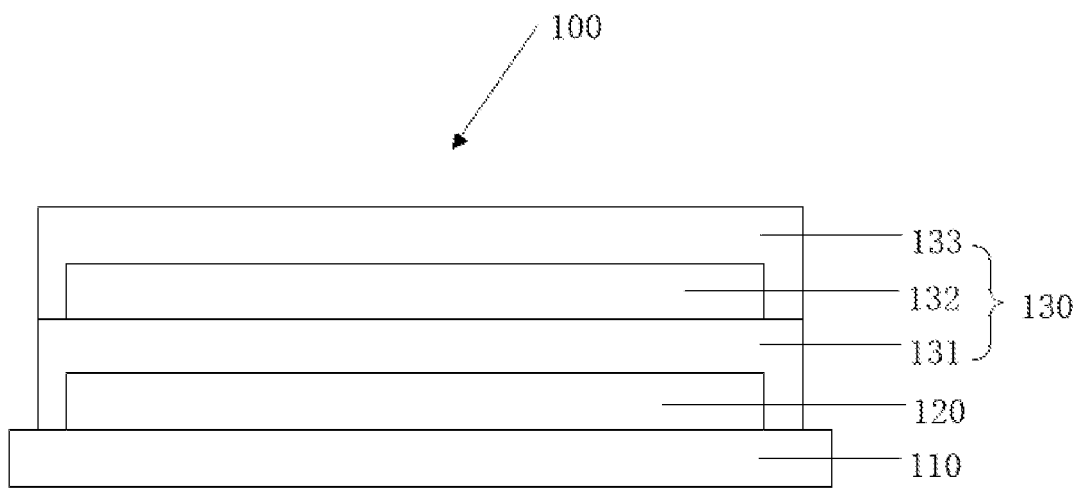
FIG. 1 is a schematic structural diagram of a display panel provided in the prior art.

DESCRIPTION OF THE DRAWINGS IN THE BACKGROUND display panel 100; array substrate 110;
OLED light emitting device 120; thin film encapsulation layer 130;
first inorganic layer 131; first organic layer 132; second inorganic layer 133.

Description of the Drawings in the Specific Embodiments display panel 100; array substrate 110;
OLED light emitting device 120;
scattering layer 210; micropores 211;
thin film encapsulation layer 130;
first inorganic layer 131; first organic layer 132;
second inorganic layer 133.

DETAILED DESCRIPTION OF PREFERRED EMBODIMENTS

The technical solutions in the embodiments of the present disclosure are clearly and completely described as follows with reference to the accompanying drawings in the embodiments. It is apparent that the described embodiments are only a part of the embodiments of the present disclosure, and not all of the embodiments. All other embodiments obtained by a person skilled in the art based on the embodiments of the present disclosure without inventive efforts are within the scope of the present disclosure.

In the present disclosure, unless otherwise expressly stated and defined, the description that "a first feature is on or under a second feature" may mean that the first feature directly contacts the second feature, or mean that the first feature contacts the second feature via another feature therebetween, rather than directly contact the second feature. Moreover, the description that "the first feature is on/above/over the second feature" may mean that the first feature is directly or obliquely on/above/over the second feature, or just mean the horizontal height of the first feature is higher than that of the second feature. The description that "the first feature is under/below/beneath the second feature" may mean that the first feature is directly or obliquely under/below/beneath the second feature, or just mean the horizontal height of the first feature is lower than that of the second feature.

The following description provides a number of different embodiments or examples for implementing the different structures of the present disclosure. In order to simplify the present disclosure, components and arrangements of specific examples are described below. Certainly, the examples are merely exemplary and are not intended to limit the present disclosure. In addition, for the sake of simplicity and clarity, the reference numerals and/or the reference letters may repeat in different examples in the present disclosure, which does not indicate the relationship between the various discussed embodiments and/or arrangements. Moreover, the examples of various specific processes and materials are provided in the present disclosure, but a person of ordinary skill in the art will appreciate the application of other processes and/or the use of other materials.

Figure 2:
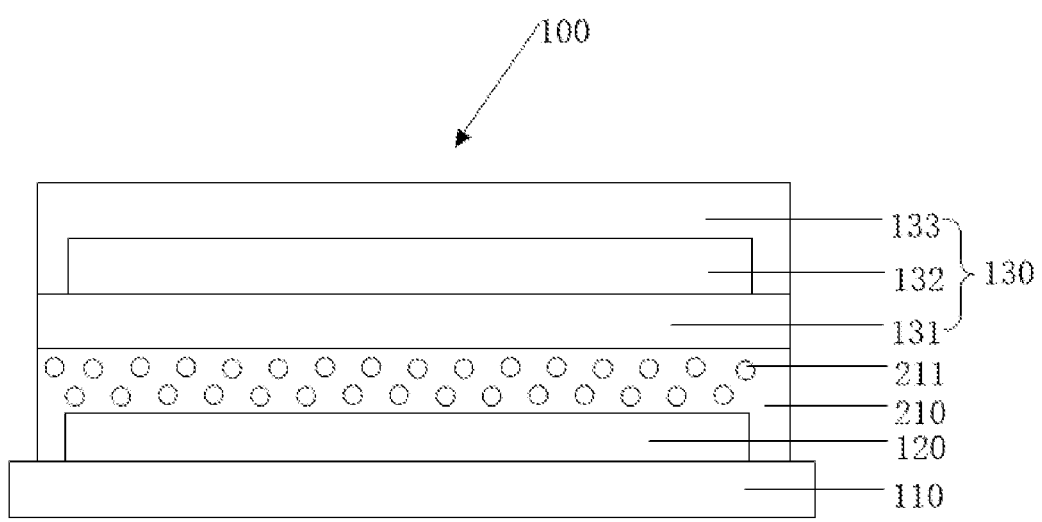
FIG. 2 is a schematic structural diagram of a display panel provided in an embodiment of the present disclosure.

An embodiment of the present disclosure provides a display panel 100. Refer to FIG. 2, which is a schematic structural diagram of a display panel 100 provided in an embodiment of the present disclosure. The display panel 100 includes an array substrate 110, an organic light emitting diode (OLED) light emitting device 120, a scattering layer 210, and a thin film encapsulation layer 130.

The OLED light emitting device 120 is disposed on a side of the array substrate 110. Specifically, the OLED light emitting device 120 includes an anode layer, a hole transport layer, a light emitting layer, an electron transport layer, and a cathode layer. The anode layer is disposed on the array substrate 110, the hole transport layer is disposed on the anode layer, the light emitting layer is disposed on the hole transport layer, the electron transport layer is disposed on the light emitting layer, and the cathode layer is disposed on the electron transport layer. Since the design key point of the present disclosure is the scattering layer 210, the OLED light emitting device 120 is not described in detail herein.

The scattering layer 210 is disposed on a side of the OLED light emitting device 120 away from the array substrate 110 and covers the OLED light emitting device 120, wherein the scattering layer 210 has a plurality of micropores 211 therein.

In this embodiment, a material of the scattering layer 210 is silicon nitride. In other embodiments, the material of the scattering layer 210 may also be silicon oxide, but is not limited herein.

A thickness of the scattering layer 210 ranges from 0.1 μm to 2 μm, and diameters of the micropores 211 ranges from 10 nm to 50 nm.

The scattering layer 210 is disposed on an OLED light emitting device 120, and the scattering layer 210 has the plurality of micropores, so that when the OLED light emitting device emits light, the light is scattered to the surroundings through the micropores 211 in the scattering layer 210, thereby improving the light extraction rate of the OLED light emitting device 120 and improving the overall performance of the display panel 100.

The thin film encapsulation layer 130 is disposed on the side of the OLED light emitting device 120 away from the array substrate 110. Specifically, the thin film encapsulation layer 130 includes a first inorganic layer 131, a first organic layer 132, and a second inorganic layer 133. The first organic layer 132 is disposed on the first inorganic layer 131. The second inorganic layer 133 is disposed on the first organic layer 132.

In this embodiment, the scattering layer 210 is disposed between the cathode layer and the first inorganic layer 131.

In other embodiments, the scattering layer 210 may also be disposed between the first inorganic layer 131 and the first organic layer 132, and cover the OLED light emitting device 120 and the first inorganic layer 131. Otherwise, the scattering layer 210 is disposed between the first organic layer 132 and the second inorganic layer 133, and covers the OLED light emitting device 120, the first inorganic layer 131, and the first organic layer 132. Otherwise, the scattering layer 210 is disposed on the second inorganic layer 133, and covers the OLED light emitting device 120 and the thin film encapsulation layer 130.

Figure 3:
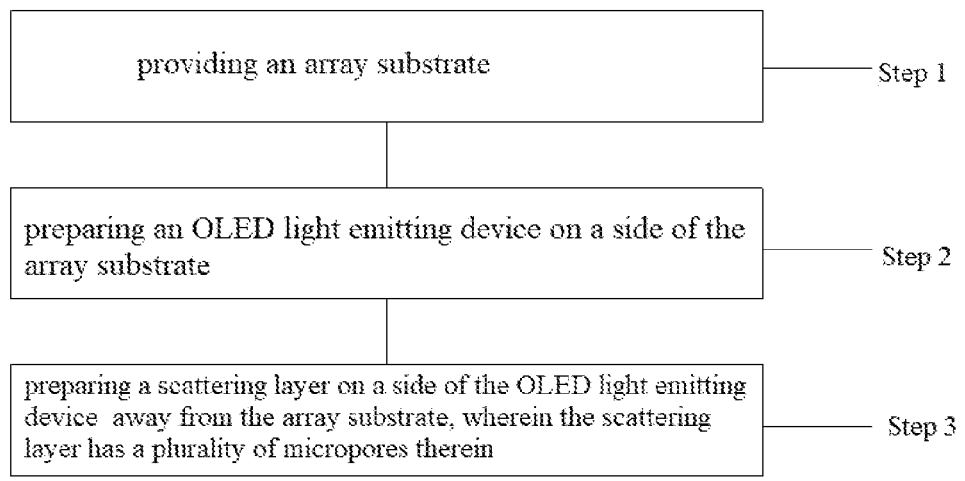
FIG. 3 is a flowchart of a method for manufacturing a display panel provided in an embodiment of the present disclosure.

An embodiment of the present disclosure also provides a preparation method for preparing a display panel 100 in accordance with the present disclosure. Refer to FIG. 3, which is a flow chart of the method for preparing the display panel 100 provided in an embodiment of the present disclosure, which includes Step 1 to Step 3.

Step 1 of providing an array substrate 110.

Step 2 of preparing an OLED light emitting device 120 on a side of the array substrate 110.

Step 3 of preparing a scattering layer 210 on a side of the OLED light emitting device 120 away from the array substrate 110, wherein the scattering layer 210 has a plurality of micropores 211 therein.

Step 3 of preparing the scattering layer 210 specifically includes Steps 31 to Steps 33.

Step 31 of preparing a silicide film on the side of the OLED light emitting device 120 away from the array substrate 110, wherein the silicide film is prepared by chemical deposition or inkjet printing.

Step 32 of implanting ions into the silicide film.

Step 33 of annealing the ions implanted silicide film, wherein the ions form micropores 211 in the silicide film to form the scattering layer 210.

In this embodiment, the silicide film is a silicon nitride film, and the ions are helium ions. In other embodiments, a material of the scattering layer 210 may also be a silicon oxide film. The material of the scattering layer 210 may not be limited to a silicide film, as long as the material ensures that the micropores 211 can be formed in the layer after the ion implantation and annealing process.

After Step 3, Step 4 is further performed: preparing a thin film encapsulation layer 130 on the side of the OLED light emitting device 120 away from the array substrate 110. Specifically, Step 4 includes Steps 41-Steps 43.

Step 41 of preparing the first inorganic layer 131 on the scattering layer.

Step 42 of preparing the first organic layer 132 on the first inorganic layer 131.

Step 43 of preparing the second inorganic layer 133 on the first organic layer 132.

In this embodiment, the scattering layer 210 is disposed between the cathode layer and the first inorganic layer 131. In other embodiments, the scattering layer 210 may also be disposed between the first inorganic layer 131 and the first organic layer 132, or the scattering layer 210 is disposed on the second inorganic layer 133. Therefore, Step 42 may also be preparing the scattering layer on the first inorganic layer 131, and preparing the first organic layer 132 on the first inorganic layer 131. Step 43 may also be preparing the scattering layer on the first organic layer 132, and preparing the second inorganic layer 133 on the first organic layer 132. Otherwise, Step 4 further includes Step 44 of preparing the scattering layer on the second inorganic layer 133.

The scattering layer 210 is disposed on an OLED light emitting device 120 or between each layer of the thin film encapsulation layer 130, and the scattering layer 210 has the plurality of micropores, so that when the OLED light emitting device emits light, the light is scattered to the surroundings through the micropores 211 in the scattering layer 210, thereby improving the light extraction rate of the OLED light emitting device 120 and improving the overall performance of the display panel 100.

To achieve the above object, the present disclosure also provides a display device, including the display panel 100 in accordance with the present disclosure.

The beneficial effect of the present disclosure is that a display panel, a manufacturing method thereof, and a display device are provided, wherein the scattering layer is disposed on an OLED light emitting device, and the scattering layer has the plurality of micropores, so that when the OLED light emitting device emits light, the light is scattered to the surroundings through the micro holes in the scattering layer, thereby improving the light extraction rate of the OLED light emitting device and improving the overall performance of the display panel.

In the above embodiments, the description of each embodiment has its own emphasis. For a part that is not detailed in an embodiment, refer to related descriptions in other embodiments.

The display panel, the preparation method thereof, and the display device provided in the embodiments of the present disclosure are described in detail above. Specific embodiments are used herein to explain the principles and implementation of the present disclosure. The above embodiments are used to assist in understanding the technical solutions and the core ideas of this disclosure. Those of ordinary skill in the art should understand that the technical solutions described in the foregoing embodiments can be modified, or some of the technical features can be replaced. These modifications and replacements do not substantially deviate the corresponding technical solutions from the scopes of the technical solutions of the embodiments of the present disclosure.

What is claimed is:

1. A display panel, comprising:
   an array substrate;
   an organic light emitting diode (OLED) light emitting device disposed on a side of the array substrate; and
   a scattering layer dispoed on a side of the OLED light emitting device away from the array substrate, and covering the OLED light emitting device;
   wherein the scattering layer has a plurality of micropores,
   wherein diameters of the micropores range from 10 nm to 50 nm, and
   wherein a material of the scattering layer is silicon nitride, and a thickness of the scattering layer ranges from 0.1 μm to 2 μm.

2. The display panel as claimed in claim 1, wherein the OLED light emitting device comprises:
   an anode layer disposed on the array substrate;
   a hole transport layer disposed on the anode layer;
   a light emitting layer disposed on the hole transport layer;
   an electron transport layer disposed on the light emitting layer; and
   a cathode layer disposed on the electron transport layer.

3. The display panel as claimed in claim 2, further comprising
   a thin film encapsulation layer disposed on the side of the OLED light emitting device away from the array substrate, and including:
   a first inorganic layer;
   a first organic layer disposed on the first inorganic layer; and a second inorganic layer disposed on the first organic layer;

wherein the scattering layer is disposed on the second inorganic layer.

4. A preparation method for preparing the display panel as claimed in claim 1, comprising:

a step of provide an array substrate;

a step of preparing an organic light emitting diode (OLED) light emitting device disposed on a side of the array substrate; and a step of preparing a scattering layer on a side of the OLED light-emitting device away from the array substrate; wherein the scattering layer has a plurality of micropores, wherein diameters of the micropores range from 10 nm to 50 nm, wherein the step of preparing the scattering layer includes:

a step of preparing a silicide film on the side of the OLED light emitting device away from the array substrate;

a step of implanting ions into the silicide film; and a step of annealing the ions implanted silicide film, wherein the ions form micropores in the silicide film to form the scattering layer, and wherein the silicide film includes a silicon nitride film, and the ions are helium ions.

5. The preparation method as claimed in claim 4, wherein the silicide film is prepared by chemical deposition or inkjet printing.

6. A display device comprising a display panel, wherein the display panel comprises:

an array substrate;

an organic light emitting diode (OLED) light emitting device disposed on a side of the array substrate; and a scattering layer dispoed on a side of the OLED light emitting device away from the array substrate, and covering the OLED light emitting device;

wherein the scattering layer has a plurality of micropores, wherein diameters of the micropores range from 10 nm to 50 nm, and wherein a material of the scattering layer is silicon nitride, and a thickness of the scattering layer ranges from 0.1 μm to 2 μm.

7. The display device as claimed in claim 6, wherein the OLED light emitting device comprises:

an anode layer disposed on the array substrate;

a hole transport layer disposed on the anode layer;

a light emitting layer disposed on the hole transport layer;

an electron transport layer disposed on the light emitting layer; and a cathode layer disposed on the electron transport layer.

8. The display device as claimed in claim 7, wherein the display panel further comprises:

a thin film encapsulation layer disposed on the side of the OLED light emitting device away from the array substrate, and including:

a first inorganic layer;

a first organic layer disposed on the first inorganic layer; and a second inorganic layer disposed on the first organic layer;

wherein the scattering layer is disposed on the second inorganic layer.

\* \* \* \* \*